United States Patent
Nishihashi et al.

(10) Patent No.: US 6,930,316 B2
(45) Date of Patent: Aug. 16, 2005

(54) ION IMPLANTATION SYSTEM AND ION IMPLANTATION METHOD

(75) Inventors: Tsutomu Nishihashi, Chigasaki (JP); Junki Fujiyama, Chigasaki (JP); Yuzo Sakurada, Chigasaki (JP)

(73) Assignee: Ulvac, Inc., Kanagawa-Ken (JP)

(*) Notice: Subject to any disclaimer, the term of this patent is extended or adjusted under 35 U.S.C. 154(b) by 411 days.

(21) Appl. No.: 10/011,869

(22) Filed: Dec. 3, 2001

(65) Prior Publication Data

US 2002/0066872 A1 Jun. 6, 2002

(30) Foreign Application Priority Data

| Dec. 6, 2000 | (JP) | 2000-372067 |
| Jun. 27, 2001 | (JP) | 2001-194852 |
| Nov. 9, 2001 | (JP) | 2001-345158 |
| Nov. 29, 2001 | (JP) | 2001-363797 |

(51) Int. Cl.[7] .................. H01J 37/08; G21G 5/00
(52) U.S. Cl. .............. 250/492.21; 250/492.3; 250/309
(58) Field of Search ............ 250/492.21, 492.22, 250/492.3, 492.2

(56) References Cited

U.S. PATENT DOCUMENTS

| 3,434,894 A | * | 3/1969 | Gale .................... 438/514 |
| 3,566,829 A | * | 3/1971 | Hill .................. 118/723 FI |
| 3,723,730 A | * | 3/1973 | Gordon et al. .......... 250/298 |
| 4,088,895 A | * | 5/1978 | Martin ................ 250/492.2 |
| 4,151,420 A | * | 4/1979 | Keller et al. .......... 250/492.2 |
| 4,451,738 A | * | 5/1984 | Smith ................. 250/492.2 |
| 4,578,589 A | * | 3/1986 | Aitken ................ 250/492.2 |
| 4,703,180 A | * | 10/1987 | Taya ..................... 250/425 |
| 4,847,504 A | * | 7/1989 | Aitken ................ 250/492.2 |
| 5,017,508 A | * | 5/1991 | Dodt et al. .............. 438/139 |
| 5,196,706 A | * | 3/1993 | Keller et al. ......... 250/396 R |
| 5,300,785 A | * | 4/1994 | Aitken ................ 250/492.2 |
| 5,315,118 A | * | 5/1994 | Mous ................ 250/396 ML |
| 5,378,899 A | * | 1/1995 | Kimber .............. 250/492.21 |
| 5,539,203 A | | 7/1996 | Ohdomari |
| 5,907,158 A | * | 5/1999 | Nasser-Ghodsi et al. ...... 250/492.21 |
| 6,207,963 B1 | * | 3/2001 | Benveniste ......... 250/492.21 |
| 6,286,644 B1 | * | 9/2001 | Wakui ................... 188/378 |
| 6,335,534 B1 | * | 1/2002 | Suguro et al. ........ 250/492.21 |
| 6,521,897 B1 | * | 2/2003 | Lindquist et al. ....... 250/423 F |
| 6,534,775 B1 | * | 3/2003 | Harrington et al. .... 250/492.21 |

OTHER PUBLICATIONS

Japanese Patent Opening Gazette No. 288680/1999.
Japanese Patent Opening Gazette No. 003881/2000.

* cited by examiner

Primary Examiner—John R. Lee
Assistant Examiner—Kalimah Fernandez
(74) Attorney, Agent, or Firm—Carothers & Carothers

(57) ABSTRACT

In an ion implantation system including (a) an ion source (b) a mass analyzing portion, (c) an ion acceleration portion, (d) an ion beam focusing/deflecting portion, and (e) an end station chamber for implanting ions onto a semiconductor substrate. The ion source consists of plural ion sources being connected to the same mass analyzing portion in which any one of the plural ion sources is selected. Mass-separated ions from the ion source are led to the acceleration portion, and a stencil mask is arranged approximately to the semiconductor substrate in the end station chamber.

15 Claims, 13 Drawing Sheets

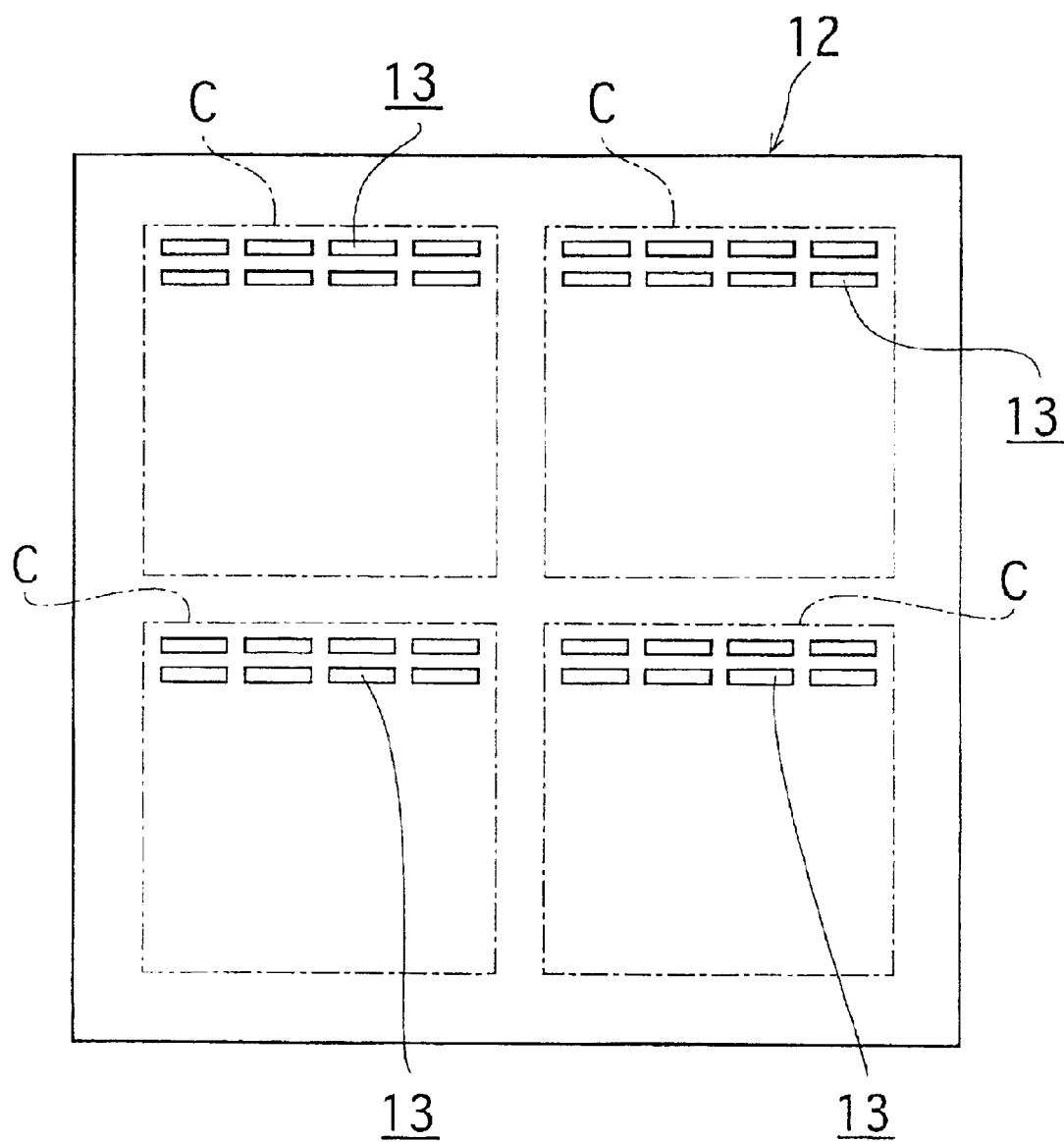

ION IMPLANTATION SYSTEM AND ION IMPLANTATION METHOD

BACKGROUND OF THE INVENTION

1. Field of the Invention

This invention relates to an ion implantation system and an ion implantation method and more particularly to an ion implantation system and an ion implantation method which can select suitably an implantation energy and implantation dose when impurity ions are implanted on a specific region of a semiconductor substrate of a semiconductor device, or of a semiconductor film for forming a semiconductor element on a glass substrate of a FPD (Flat Panel Display) apparatus.

2. Description of the Prior Art

In the manufacture of the semiconductor device or FPD apparatus, there is the process that impurity ions are doped into a specific region of a semiconductor device, or of a semiconductor film for forming a semiconductor element on a glass plate, using an ion implantation system.

An ion lithography technique is usually used for implanting impurity ions on the specified region. Hereafter, "semiconductor substrate" is assumed to include "semiconductor film for forming a semiconductor element". In the lithographic technique, photo-resist coating, exposure to light, photo-resist development, photo-resist ashing and wet cleaning are required. Those processes are essential in the conventional ion-implantation process. Then, an ion beam is scanned on the whole surface of the semiconductor substrate to implant the impurity ions on the specified regions through the openings of the resist film, and the remaining resist film is removed.

In the above ion beam scanning process, it is required that the ion beam is incident on the whole surface of the semiconductor substrate at the right angle. This requirement causes the distance between the ion source and the semiconductor substrate to be long. When a semiconductor substrate is large sized, such as 300 mmΦ in diameter, an ion implantation system is large-sized and causes the cost to rise. For solving such a problem or for small-sizing the apparatus, the Japanese Patent Opening Gazette No. 288680/1999 discloses the apparatus in which a beam shielding mask is arranged above the semiconductor substrate, and moved in the X-direction and Y-direction for implanting the ions on one chip.

In the doping process of the impurity ions onto the specified regions of the semiconductor substrate, it is required that the kinds of implanted ion, the ion implantation energies and the ion doses be changed. In the conventional ion implantation step, the resist film forming process and the ion implantation process are required to be repeated five to ten times. Such an ion implantation step is very troublesome. The resist film forming process is a wet process, and it is required that the waste fluid is safely and securely treated. For such a problem, the Japanese Patent Opening Gazette No. 003881/2000 improves the ion implantation system disclosed in the above Japanese Patent Opening Gazette No. 288680/1999. In the improved ion implantation system, a stencil mask having openings in correspondence with the specified regions to be implanted, is used instead of the above beam shielding mask. The distance between the stencil mask and the semiconductor substrate is less than about 50 $\mu$m.

In an ion implantation system disclosed in U.S. Pat. No. 5,539,203, a PF ion source and a CS sputtering ion source are connected to a switching magnet. The switching magnet is used not only to select one of the two ion sources but also to select a desired kind of ion beam from the selected ion source. The ion beam thus selected by the switching magnet is focused by an electrostatic lens.

At the end, a target chamber and a PIXE chamber are arranged. This patent is directed to a low-energy (0 to 100 keV) or high energy (1 to 4 MeV) single ion implantation system in which single ions are extracted from a focused ion beam or micro-ion beam by beam chopping.

SUMMARY OF THE INVENTION

As above described, the small-sizing of the ion implantation system and the rationalizing of the ion implantation step have been developed. However, when ions are implanted on specified regions of a semiconductor substrate, it is required that the kinds of ions, the ion implantation energies and ion doses are changed. Plural ion implantation systems have been required.

Accordingly, it is an object of this invention to provide an ion implantation system and an ion implantation method which can be small sized and by which the kinds of ions, the ion implantation energies and the ion dose can be changed in one unit.

In accordance with an aspect of this invention, in an ion implantation system including (a) an ion source means, (b) a mass analyzing portion, (c) an ion acceleration portion, (d) an ion beam focusing/deflecting portion, and (e) an end station chamber for implanting ions onto a semiconductor substrate, the improvement resides in that the ion source means consists of plural ion sources being connected to said mass analyzing portion in which any one of said plural ion sources is selected. Mass-separating ions from said ion source are led to the acceleration portion, and a stencil mask means is arranged approximately to said semiconductor substrate in said end station chamber.

In accordance with another aspect of this invention, in an ion implantation method including (a) the step of extracting ions from ion source means and mass-analyzing said ions; (b) the step of accelerating said ions; (c) the step of converging and deflecting said ion beam; and (d) the step of implanting said ions onto a semiconductor substrate, the improvement in said step of extracting ions from ion source means and mass-analyzing said ions, comprises a first step of selecting one ion source from said plural ion sources, extracting ions from said selected one ion source and a second step of mass-analyzing said ions by the same mass analyzing portion and leading said mass-analyzed ions to the same accelerating portion.

The foregoing and other objects, features, and advantages of the present invention will be more readily understood upon consideration of the following detailed description of the preferred embodiments of the invention, taken in conjunction with the accompanying drawings.

BRIEF DESCRIPTION OF THE DRAWINGS

FIG. 3 is a plan view of a stencil mask for four chips;

DESCRIPTION OF THE PREFERRED EMBODIMENTS

In the ion implantation system and the ion implantation method of this invention, plural ion sources, as ion source means, are connected to the same mass-analyzing portion in which the strength of applied magnetic field can be changed, and any one of the plural ion sources is selected with the strength of the applied magnetic field, and ions extracted from the selected ion source are led into the same acceleration portion.

Figure 1:
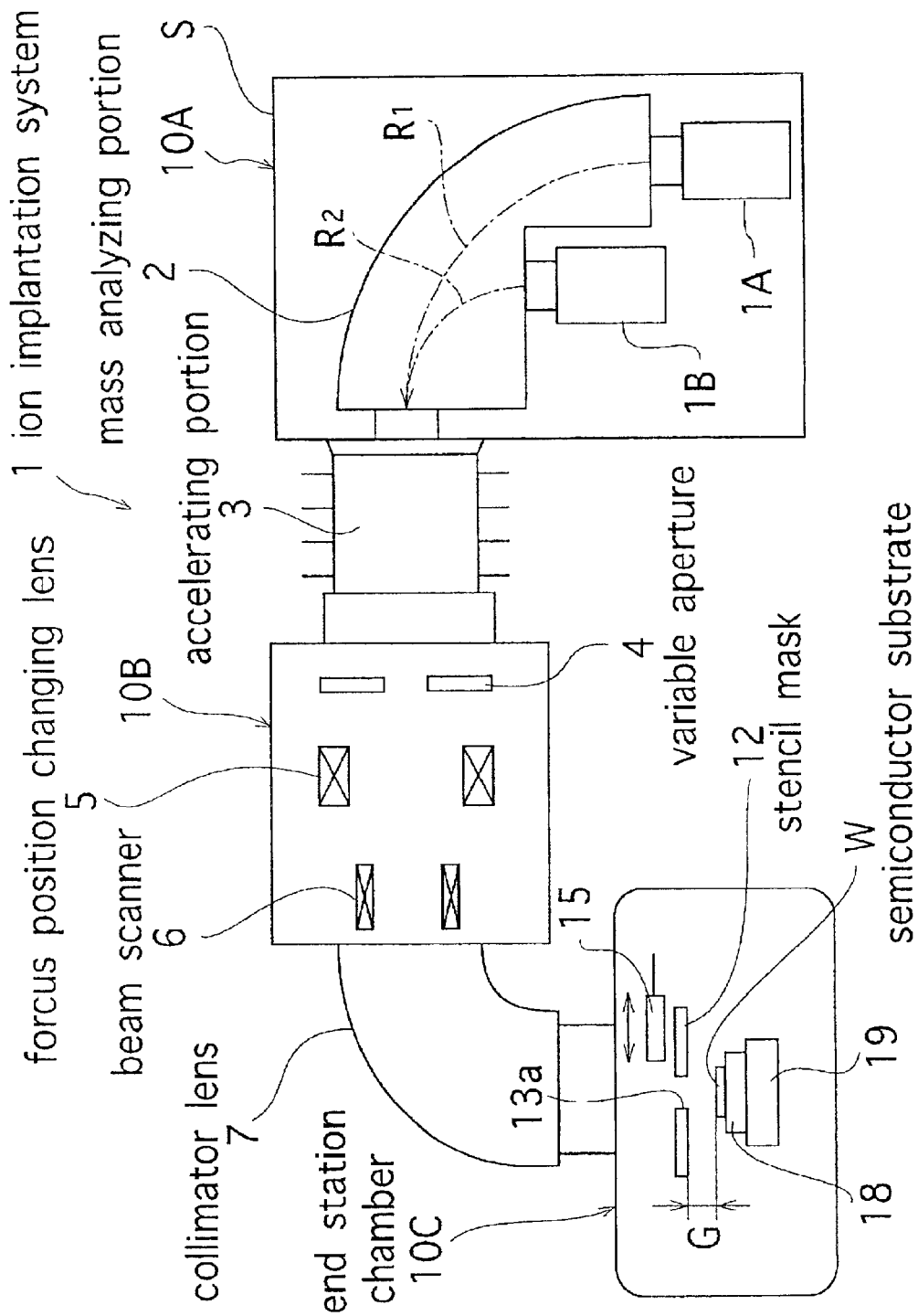
FIG. 1 is a schematic view of an ion implantation system according to one embodiment of this invention.

FIG. 1 shows one example of a constitution of an ion implantation system according to this invention. An ion implantation system 1 is a vacuum system which consists of a high voltage terminal 10A, a beam line portion 10B and an end station chamber 10C. A multi-charged ion source 1A and a high current ion source 1B are arranged on the high voltage terminal 10A. The multi-charged ion source 1A is used for implanting ions at high energy, and the high current ion source 1B is used for implanting ions at high dosage. They are connected to a mass-analyzing portion 2. Any one of the ion beams extracted from the ion sources 1A and 1B is selected by the mass analyzing portion 2, for implanting ions onto a semiconductor substrate.

An accelerating portion 3 is connected to the high voltage terminal 10A to accelerate the ions to a predetermined energy. In the beam line portion 10B connected to the accelerating portion 3, a variable aperture 4, a focus point changing lens 5, a beam scanner 6 and a collimator lens 7 are arranged in the shown order. In an end station chamber 10C, a semiconductor substrate W is held on a substrate holder 18 which is fixed to an X-Y-Z (θ) (Tilt) stage 19, and it is movable, in the X-, Y-, and Z directions by the stage 19. A stencil mask 12 is arranged approximately above the semiconductor substrate W for limiting ion implantation regions. The ions are implanted through the stencil mask 12 onto the semiconductor substrate W.

In the well and channel formation of the semiconductor substrate W, the concentration of the impurities in the specified depth of the semiconductor substrate W is so controlled as to obtain a predetermined distribution of the impurities, with an accurate ion implantation. In that case, a hot cathode type ion source such as Bernas type or Freeman type ion source, or an ECR (Electronic Cyclotron Resonance) type is usually used for implanting high energy ions of acceleration energy 200 KeV to 3 MeV. And so the multi-charged ion source 1A is selected. The ions are implanted at a "low" to "medium" dosage into a specified region of the semiconductor substrate W at the dosage level of about $10^{11}$ to $10^{14}$ ions/cm$^2$. Of course, the ions may be implanted into the semiconductor substrate at a high dosage level such as $10^{14}$ to $10^{16}$ ions/cm$^2$. The dosage level may be suitably selected. Ions such as $B^{2+}$, $P^{2+}$, $P^{3+}$, $P^{4+}$ or $As^{2+}$, $As^{3+}$, $As^{4+}$ are produced in the multi-charged ion source 1A.

When source and drain regions are formed in a semiconductor substrate, impurities are implanted into relatively shallow regions of the semiconductor substrate W at a high concentration usually by an ion beam of high dosage. In that case, the high current ion source 1B of hot cathode type is used. The acceleration energy is equal to 5 to 200 KeV. The ions are implanted at a few milli-amperes (mA) and at high dosage level such as $10^{14}$ to $10^{16}$ ions/cm$^2$. Of course, the ions may be implanted at a "low" to "medium" dosage such as $10^{11}$ to $10^{14}$ ions/cm$^2$.

The multi-charged ion source 1A and the high current ion source 1B are connected to the same mass analyzing portion 2 in which the strength of the applied magnetic-field can be changed. The mass-analyzed ions are introduced to the same accelerating portion 3. In plan view, the ion beam from the one ion source 1A is curved at larger radius R1 and the ion beam from the other ion source 1B is curved at smaller radius R2, by the mass analyzing portion 2. Normally when the one ion source, for example, the multi-charged ion source 1A is used, the other ion source 1B is stopped since the one ion source 1A is continuously used in most of the cases. When the ion sources are changed over, the strength of the applied magnetic-field is changed in the mass analyzing portion 2.

As above described, the orbits of the ion beams from the ion sources are changed with the strengths of the magnetic field in the mass-analyzing portion 2. Accordingly, even when the both of the ion sources 1A and 1B are always driven, the energy of ions and the kind of ions to be implanted onto the semiconductor substrate can be continuously changed. At the constant strength of the magnetic field, the ion beams from the ion sources run along the different orbits. The ion beams are separated from each other. However, it is preferable that the non-selected ion source is not driven in view of energy saving and contamination of the vacuum chamber.

The ions are accelerated to a predetermined energy in the accelerating portion 3 connected to the mass analyzing portion 2. An accelerating tube of the DC type is usually used as the accelerating portion 3.

In the beam line portion 10B, the diameter of the ion beam is regulated to a predetermined value by the variable aperture 4. It is usually equal to 3 to 5 mmφ at the "low" to "medium" dosage level for the high accurate ion implantation. Of course, it may be larger than the above value. Further, the diameter of the ion beam is usually made to be equal to 20 to 30 mmφ for a high dosage level. Of course, it may be smaller than 20 to 30 mmφ.

The focus position changing lens 5 functions to converge the ion beam of "low" to "medium" dosage level onto the semiconductor substrate W arranged in the end station chamber 10C, and functions also to converge the ion beam of high dosage level on the focus region 7f of the collimator lens 7 arranged at the downstream side. Accordingly, the diameter of the ion beam of the "low" to "medium" dosage level is almost at constant. However, the ion beam of the high dosage level is focused once on the focus region 7f of the collimator lens 7, and then defocused or diverged. An electro-static or magnetic quadra-pole lens may be used as the focus position changing lens 5.

Figure 6:
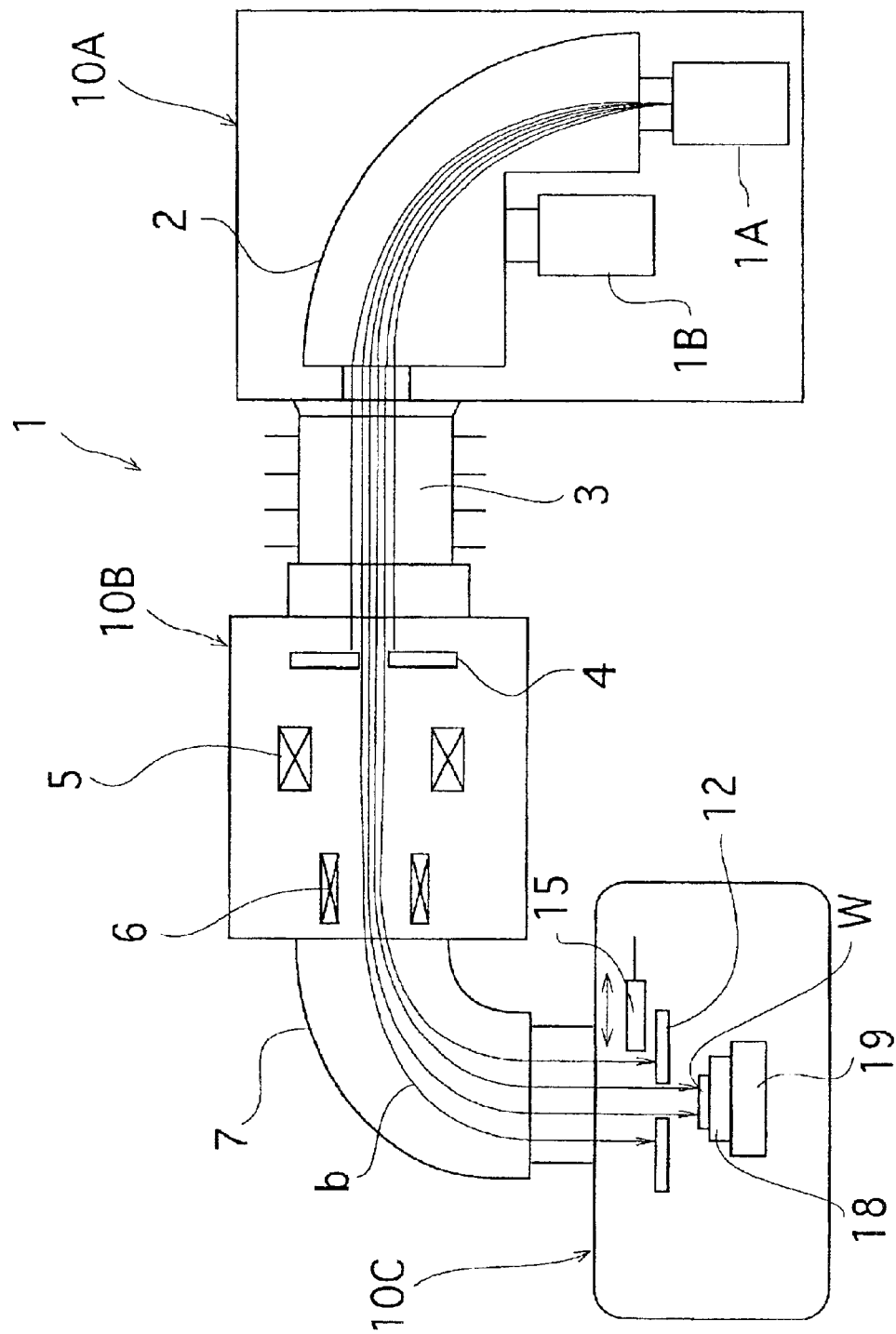
FIG. 6 is a schematic view for explaining accurate ion implantation onto a semiconductor substrate, using a "low" to "medium" level dosage ion beam from a multi-charged ion source.

The beam scanner 6 functions to scan the ion beam of the "low" to "medium" dosage level on the stencil mask 12 arranged approximately above the semiconductor substrate W with reference to FIG. 6, in the X and Y directions. When the ion beam of the high dosage level is used, the beam scanner 6 is stopped. Electro-static or magnetic quadra-pole scanner may be used as the beam scanner 6.

The collimator lens 7 makes the ion beams of the smaller diameter and of the "low" to "medium" dosage level to be parallel. The beam is scanned on the semiconductor substrate by the beam scanner 6. As above described, the ion beam of the high dosage level is defocused or diverged and made to be parallel, and it is incident on the semiconductor substrate W at the right angle. An electro-static or magnetic lens is used as the collimator lens 7. Or a toroidal coil may be used as the collimator lens 7.

In the end station chamber 10C, the semiconductor substrate W is held on the substrate holder 18 which is fixed on the X-Y-Z (θ), (Tilt) stage 19 movable in the X-Y surface and the Z-direction. The stencil mask 12 is arranged above the semiconductor substrate W, spacing a small gap G between them. The alighnment between the semiconductor substrate W and the stencil mask 12 is adjustable. The gap G between the semiconductor substrate W and the stencil mask 12 is equal to less than 50 μm.

Figure 2A:
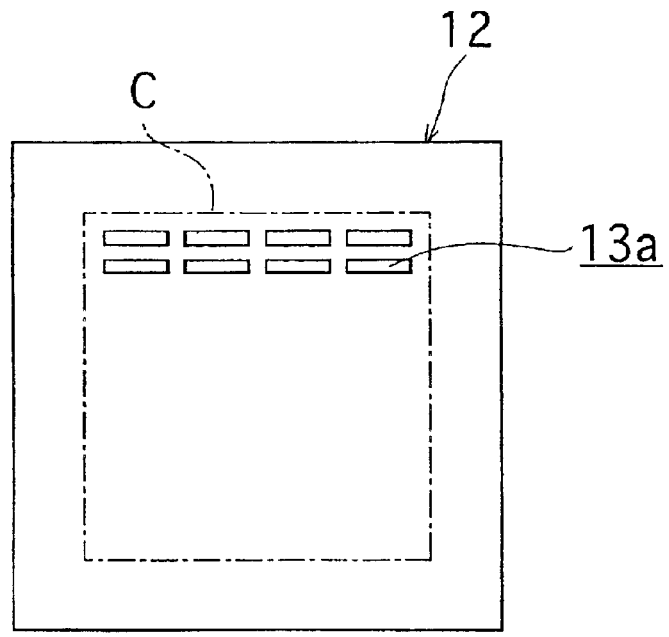
FIG. 2A and FIG. 2B are plan views of stencil masks for one chip, for implanting ions onto different regions of the one chip, respectively.
Figure 2B:
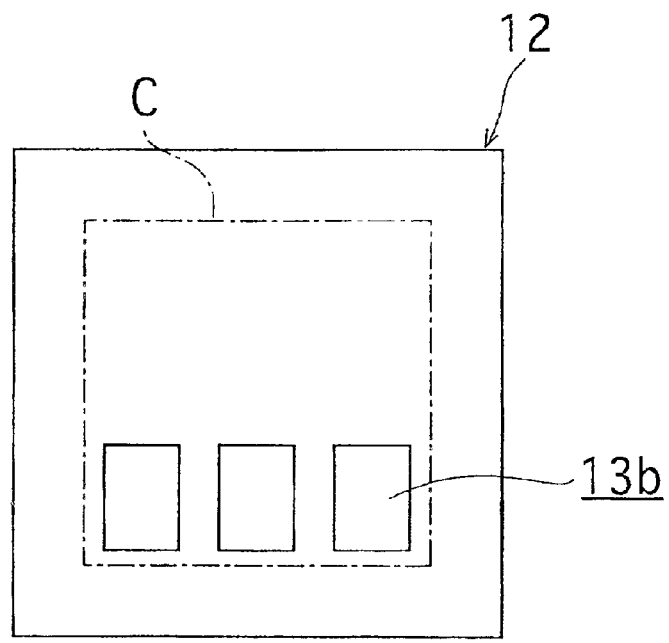

As shown in FIG. 2A and FIG. 2B, the size of the stencil mask 12 is slightly larger than the one chip of 30 mm square formed on the semiconductor substrate W, or slightly larger than the whole of the plural (four) chips arranged in the horizontal and vertical directions as shown in FIG. 3. The dot-dash lines represent the size of the one chip in FIG. 2A, FIG. 2B and FIG. 3. The openings 13a and 13b are formed in the stencil mask 12, in correspondence with the well, channel, source or drain regions formed in the chip C, as shown in FIG. 2A and FIG. 2B.

The stencil masks 12 are exchanged in use. The openings 13a and 13b may be formed in one stencil mask. When the one 13a is used, the other 13b is covered with a shutter. Such a shutter may be used as to cover alternatively the openings 13a and 13b.

Figure 4:
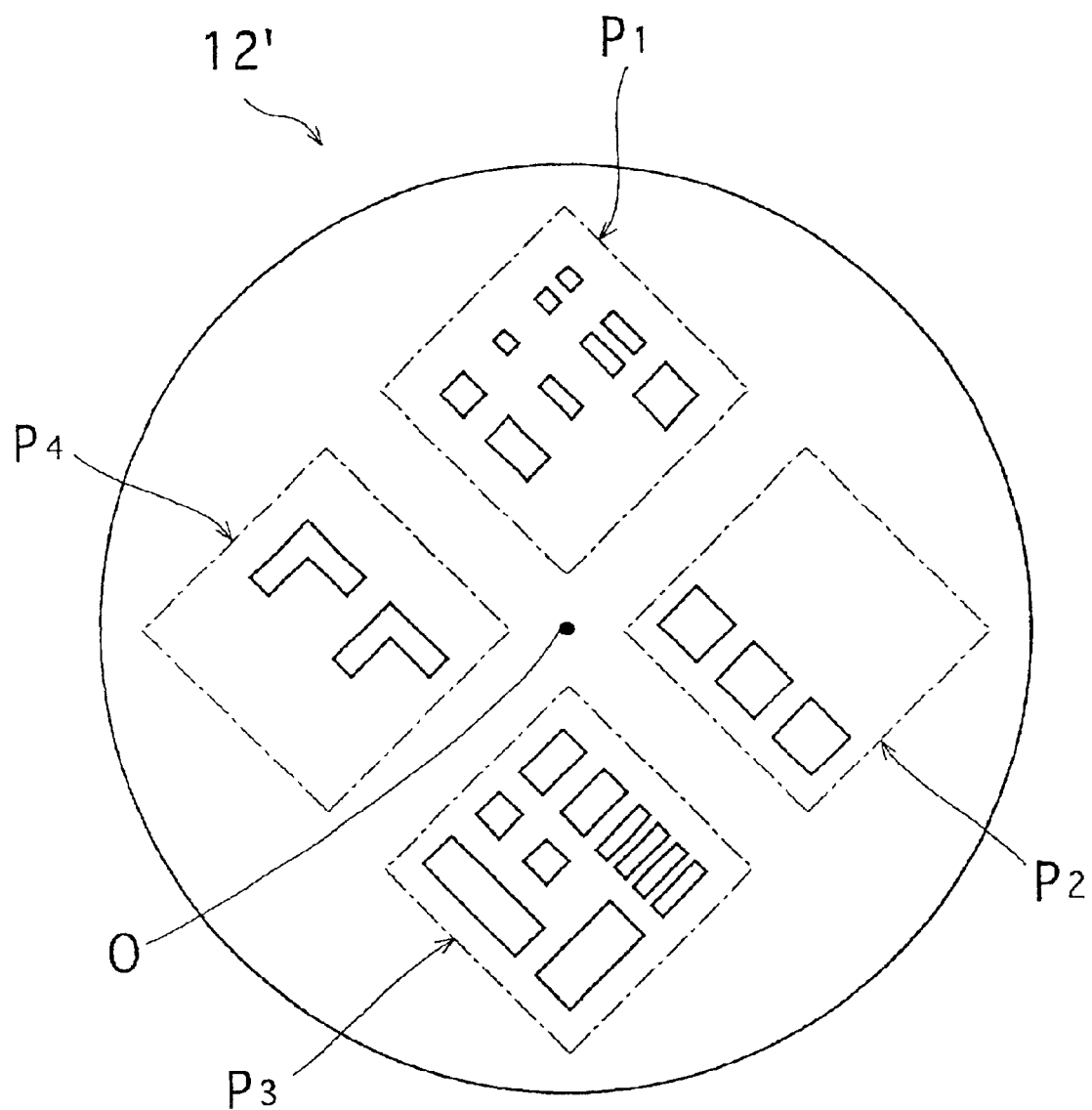
FIG. 4 is a plan view of a stencil mask for four chips, being a rotatable disk, in which openings of different patterns are made.

Further, a round stencil mask 12' as shown in FIG. 4 may be used. Openings $P_1$, $P_2$, $P_3$ and $P_4$ of different patterns are formed in the stencil mask 12. It may be rotatable around the center O so as to select any one of the opening patterns $P_1$, $P_2$, $P_3$ and $P_4$ in accordance with the necessary use.

Further in the end station chamber 10C, a beam monitor 15 is arranged at the upper stream side of the stencil mask 12 so as to be movable between a non-shutter position and a shutter position. Before the ion implantation, the beam monitor 15 is set to the shutter position, and measures the parallelism and density distribution of the ion beams. When the parallelism and density distribution are beyond the permissible ranges, the focus changing lens 5 and/or the variable aperture 4 are/is adjusted so as to put them within the permissible ranges. Or the scanning speed of the beam scanner 6 may be adjusted. The beam monitor 15 can be constructed with an array of ammeters or galvanometers. However, it can be preferably constructed with an array of small Faraday cups. The parallelism of the ion beams can be detected with high accuracy by the Faraday cups of a large aspect ratio.

In order to avoid that the stencil mask 12 is deformed with the thermal expansion due to the ion implantation and with the change of the temperature in the end station chamber 10C and so the gap G between the stencil mask 12 and the semiconductor substrate W changes with time, it is preferable that the temperature of the end station chamber 10C is controlled independently of the high voltage terminal 10A and the beam line portion 10B at the upper stream side. Any method may be adopted for the temperature control. However, it is the most economical that the whole of the end station chamber 10C is accommodated by a constant temperature tank the temperature of which is controlled.

Figure 5:
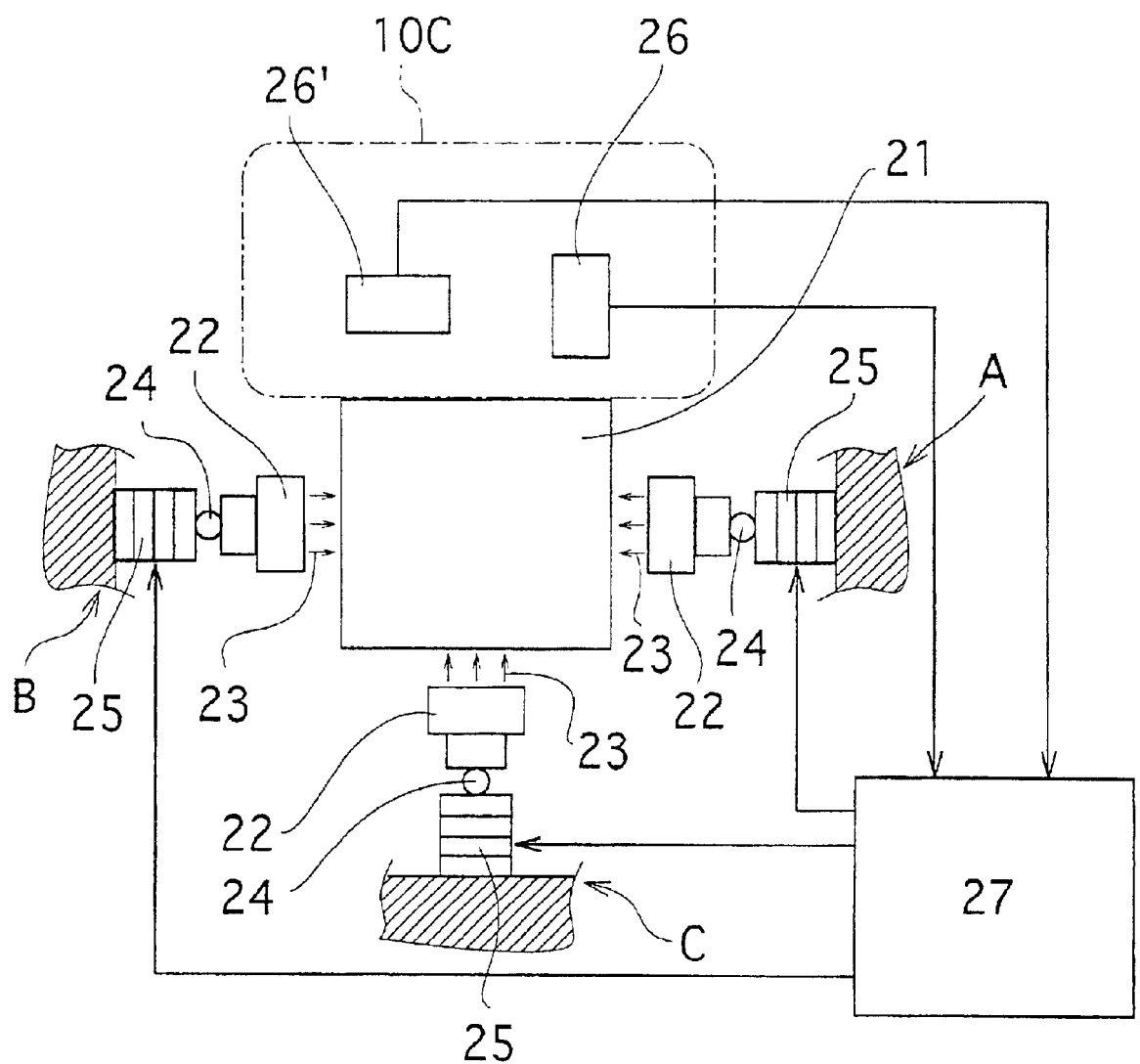
FIG. 5 is a schematic view of an active controlled vibration-shielding frame.

In the end station chamber 10C, a robot (not shown) transports the semiconductor substrate W onto the holder 18 and to the outside. A drive system drives stepwisely and periodically the stage 19 holding the semiconductor substrate W in the X-Y-Z- directions. Accordingly, the end station chamber 10C vibrates periodically due to the movements of the robot and of the X-Y-Z-stage 19. The vibration causes to take much time to align the stencil mask 12 with the semiconductor substrate W. There is the possibility that they are misaligned with each other. Accordingly, it is preferable that the whole of the end station chamber 10C is put on an active controlled vibration shielding frame 21 as shown in FIG. 5.

The active controlled vibration shielding frame 21 is supported at the sides and bottom, by airs 23 ejected from air jet units 22. The airs 23 function as air springs. Reference letters A, B and C represent vibration shielding mechanisms for the X-direction and the Z-direction, respectively. A ball spacer 24 is arranged between the air jet unit 22 and a piezo-electric actuator 25, in the respective vibration shielding mechanisms A, B and C. Displacement sensors 26 and 26' are fixed on the side wall of the end station chamber 10C. They are connected to a controller 27. The outputs are so supplied to the piezo-electric actuator 25 as to cancel the vibrations detected by the sensors 26 and 26', from the controller 27. Although not shown, a vibration shielding mechanisms similar to the mechanisms A, B and C, is arranged, facing to the side walls of the frame 21 for shielding the vibration in the Y-direction (perpendicular to the sheet of FIG. 5). Thus, the end station chamber 10C is shielded from the vibration. A magnetic floating mechanism may be used instead of the active controlled vibration shielding mechanism 21, for supporting the frame 21.

The constitution of the ion implantation system 1 according to the one embodiment of this invention has been described. Next, an ion implantation method of the ion implantation system 1 will be described.

FIG. 6 is a view for explaining the ion implantation onto the semiconductor substrate W at the "low" to "medium" dosage level ($10^{11}$ to $10^{14}$ ions/cm$^2$) such as $10^{12}$ ions/cm$^2$. The ion beam is obtained from the multi-charged ion source 1A.

The strength of the magnetic field is so designed as to be changeable in the mass-analyzing portion 2, in which, for example, strength of electric current is changed in an electro-magnetic coil. In the end station chamber 10C, the stencil mask 12 for forming well in the semiconductor substrate, as shown in FIG. 2A, is set directly above the semiconductor substrate W. Although not shown in FIG. 6, the end station chamber 10C is put on the active controlled vibration-shielding frame 21. It is substantially not vibrated, and it is put in the closed space the temperature of which is controlled. In FIG. 6, the relationships among the semiconductor substrate W, the stencil mask 12 and the opening 13a are schematically shown in size and geometry. Accordingly, FIG. 2A does not accurately coincide with FIG. 1, FIG. 6 etc.

The multi-charged ion source 1A starts to drive in the high voltage terminal 10A. Phosphorus ions P$^{2+}$ are extracted from the ion source 1A at the extraction voltage 30 kV. They are mass-separated at the mass-analyzing portion 2. And they are led into the accelerating portion 3, and they are accelerated to the energy of 1 MeV. The diameter of the beam of the accelerated ions is made to be equal to 4 mm$\phi$ by the variable aperture 4. Then, it is so adjusted as to be converged onto the semiconductor substrate W in the end station chamber 10C, by the focus position changing lens 5. And the beam scanner 6 and the collimator lens 7 are driven. The ion beams are paralleled by the collimator lens 7. They scan uniformly the mask region of the stencil mask 12. The mask region is slightly larger than the contour of the chip C as dot-dash lines in FIG. 2A. The scan beam is represented by the reference letter b. The ion beam monitor 15 is moved to the beam shielding position. The parallel and density distribution of the ion beam are measured with the ion beam monitor 15. When they are beyond the permissible ranges, they are so adjusted as to be within the permissible ranges, by one or more of the variable aperture 4, the focus position changing lens 5 and the beam scanner 6. After it is proved that they are within the permissible ranges, the beam monitor 15 is moved back to the non-shielding position. The ions are started to be implanted into the semiconductor substrate W through the opening 13a of the stencil mask 12 shown in FIG. 2A.

In this embodiment, the beam "parallel" means that the axes of the ion beams running into the collimator lens 7 at various angles are paralleled with eath other. The beam scanner 6 deflects periodically the ion beam in the X-direction and Y-direction, at the various angles. Accordingly, the axes of the ion scanned beams irradiated from the collimator lens 7 onto the semiconductor substrate W are perpendicular to the semiconductor substrate W and paralleled with each other, as shown by the downward arrows running through the openings M1 to M6 in FIG. 12.

In the above described case, the ions from the multi-charged ion source 1A are implanted onto the semiconductor substrate W at the "low" to "medium" dosage level. However, without scanning, the spot beam may be incident on the stencil mask 12 at the high dosage level such as $10^{14}$ to $10^{16}$ ions/cm$^2$. At that case, the extracted ion amount of the multi-charged ion source 1A is increased, and the beam diameter is not reduced. It is slightly larger than the mask region of the stencil mask 12.

Figure 7:
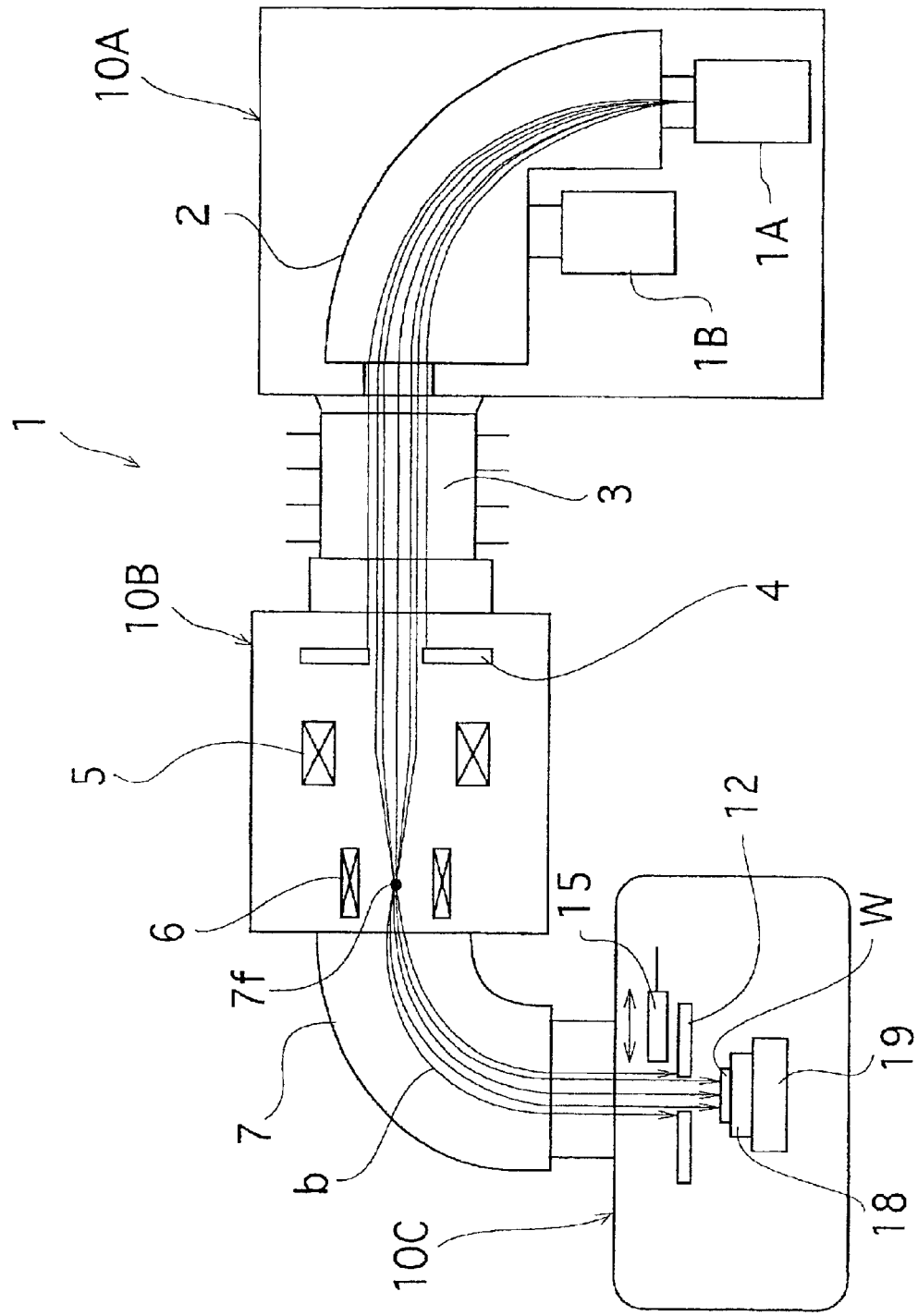
FIG. 7 is a schematic view for explaining ion implantation onto a semiconductor substrate, using a "high" level dosage ion beam from the multi-charged ion source.

FIG. 7 shows the case that the ion beams from the multi-charged ion source 1A are implanted onto the semiconductor substrate W at the high dosage level. The multi-charged ion source 1A starts to drive. The extraction voltage is raised. For example, phosphorous ion beams P$^{2+}$ are supplied to the mass-analyzing portion 2 at the dosage level of $10^{15}$ ions/cm$^2$. They are mass-separated in the mass-analyzing portion 2, and are led into the accelerating portion 3 to be accelerated to the energy of 30 keV. The diameter of the ion beam is made to be equal to 30 mm$\phi$ by the variable aperture 4.

Then, the ion beam is so adjusted as to be converged onto the focus region 7f of the collimator lens 7 by the focus position changing lens 5. The beam scanner 6 is stopped, and so the ion beam is not scanned. The collimator lens 7 is driven to defocus or diverge the ion beams from the converged region 7f and to parallel the ion beam. The ion beam of the diameter including all the openings of the stencil mask 12 reaches the stencil mask 12. The parallel and density distribution of the beam are measured with the beam monitor 15. For example, the ions are implanted onto the specified region of the semiconductor substrate W through the openings 13b of the stencil mask 12 as shown in FIG. 2B.

Figure 8:
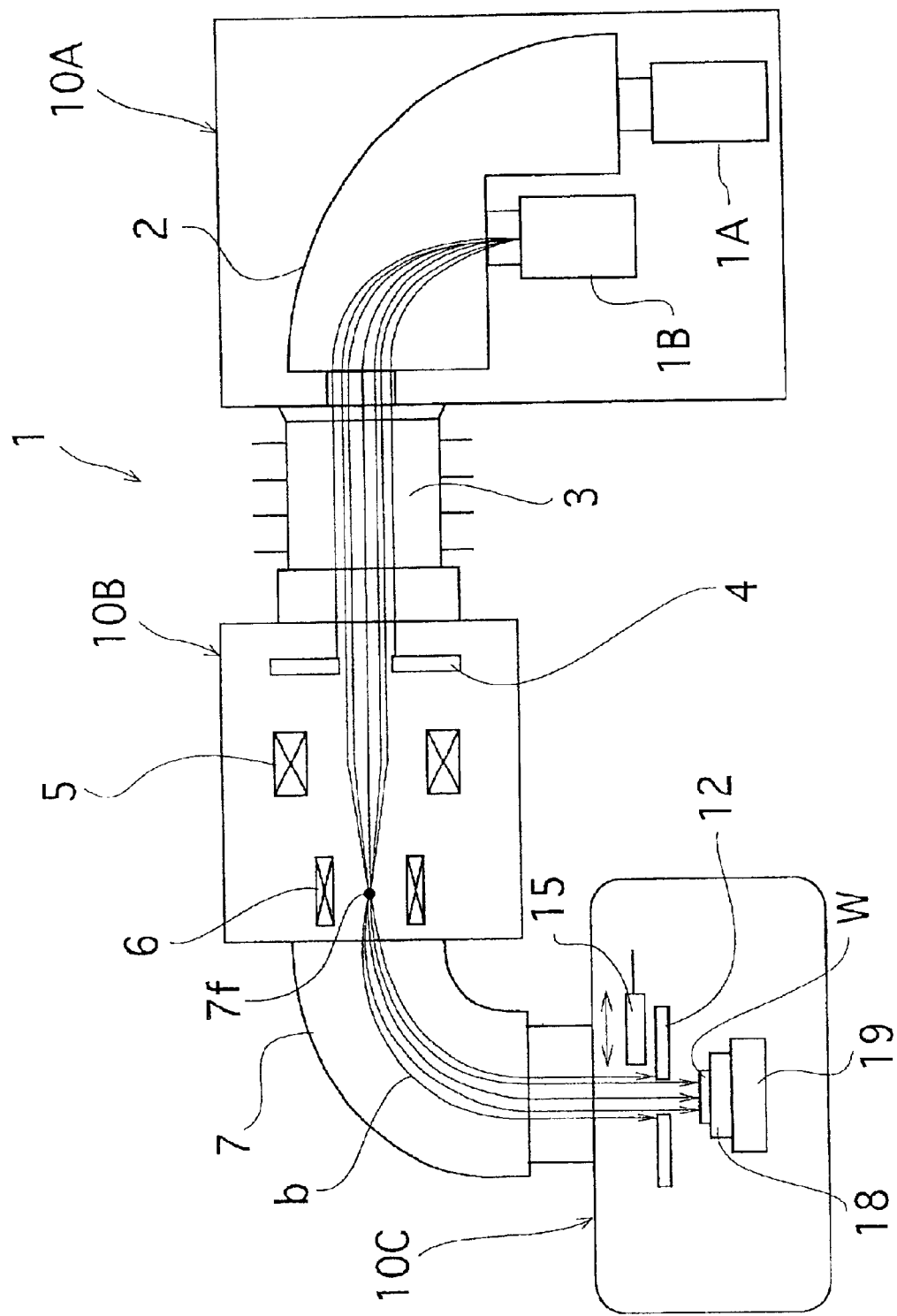
FIG. 8 is a schematic view for explaining spot ion implantation onto a semiconductor substrate, using a high dosage level ion beam from a high current ion source.

FIG. 8 shows the case that the ions are implanted onto the semiconductor substrate W by the ion beams of the high dosage level from the high current ion source 1B, in the implantation system 1. The multi-charged ion source 1A is changed over to the high current ion source 1B by changing the strength of the magnetic-field in the mass-analyzing portion 2, as shown in FIG. 6 and FIG. 8. The stencil mask 12 as shown in FIG. 2B is set in the end station chamber 10C.

The high current ion source 1B is driven in the high voltage terminal 10A. Boron (B$^{1+}$) ions are extracted at the extraction voltage 30 kV and the dosage level of $10^{15}$ ions/cm². They are mass-separated in the mass-analyzing portion 2, and led to the accelerating portion 3 to be accelerated to the energy of 30 keV. The diameter of the accelerated ion beam is made to be equal to 30 mmφ by the variable aperture 4. It is so adjusted as to be converged onto the focus region 7f of the collimator lens 7 by the focus position changing lens 5. The beam scanner 6 remains stopped. The collimator lens 7 is driven. The ion beam converged onto the focus region 7f of the collimator lens 7 is diverged from the focus region 7f, without scanning. The ion beam is paralleled in the collimator lens 7, and reaches the semiconductor substrate W in beam diameter including all the openings of the stencil mask 12 in the end station chamber 10C. The beam monitor 15 is moved to the beam shielding position from the non-shielding position to measure the parallel and density distribution of the ion beam. When they are beyond the permissible range, they are so adjusted as to be within the permissible ranges. After they are proved to be within the permissible ranges, the ion beam is passed through the openings 13b of the stencil mask 12 shown in FIG. 2B, and so the ions are implanted onto the specified regions of the semiconductor substrate W at the high dosage level.

Figure 9:
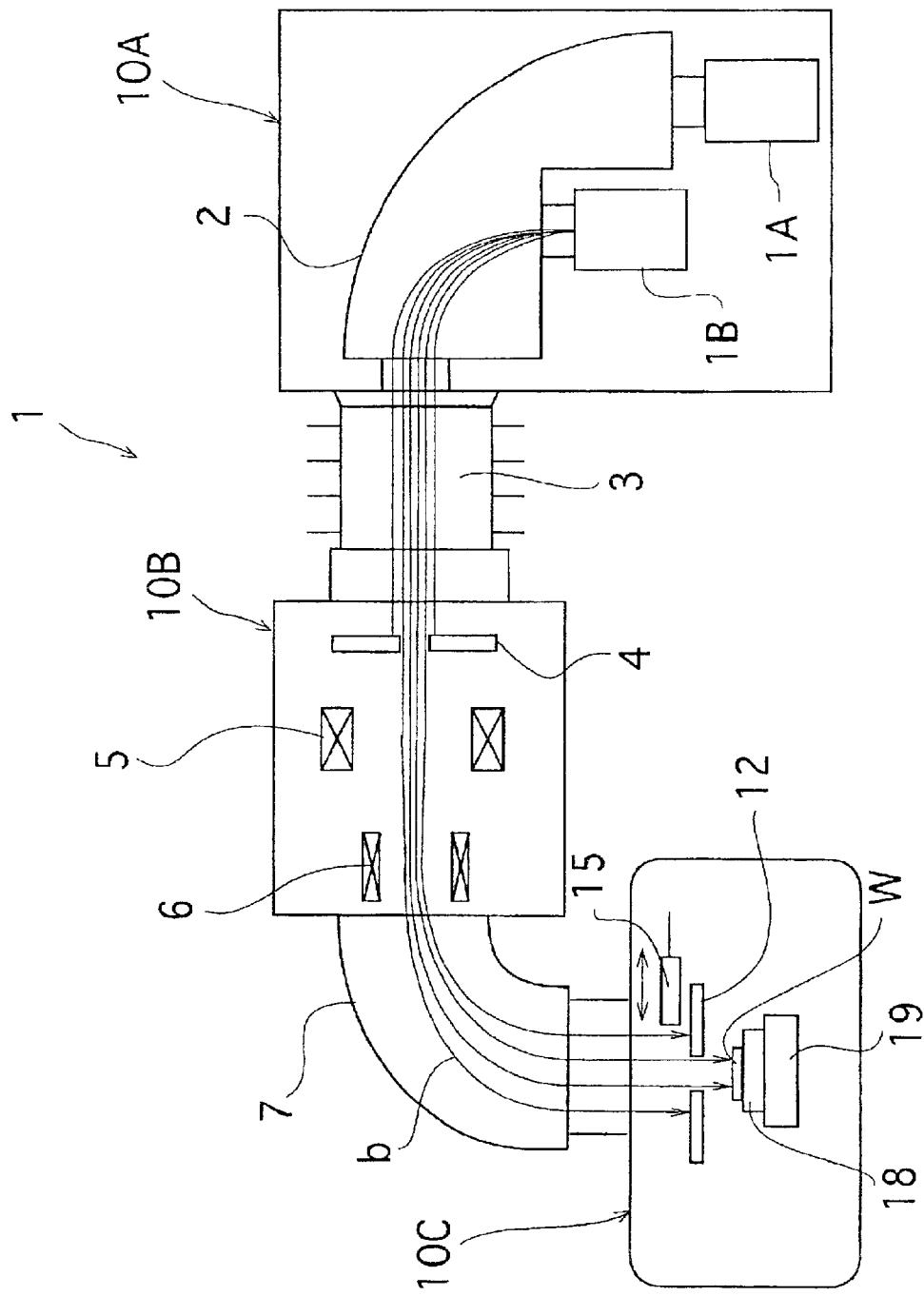
FIG. 9 is a schematic view for explaining accurate ion implantation onto a semiconductor substrate, using "low" to "medium" level dosage ion beam from the high current ion source.

An accurate ion implantation at the "low" to "medium" dosage level is also possible by the ion beam from the high current ion source 1B. FIG. 9 shows such an ion implantation. The high current ion source 1B is driven in the high voltage terminal 10A. The current value is set to low level. Boron ions ($B^{1+}$) are supplied, for example, at the dosage level of $10^{12}$ ions/cm² from the high current ion source 1B. They are mass-separated in the mass-analyzing portion 2, and led into the accelerating portion 3 to be accelerated to the energy of 1 MeV. The diameter of the accelerated beam is made to be equal to 4 mmφ by the variable aperture 4. The ion beam is so adjusted as to be converged onto the semiconductor substrate W in the end station chamber 10C, by the focus position changing lens 5. The beam scanner 6 and the collimator lens 7 are driven to parallel the ion beam and to scan uniformly the mask region of stencil mask 12. The scan beam is represented by the letter b. The behavior of the ion beam is the same as that described with reference to FIG. 6. Accordingly, further description will be omitted.

Figure 10:
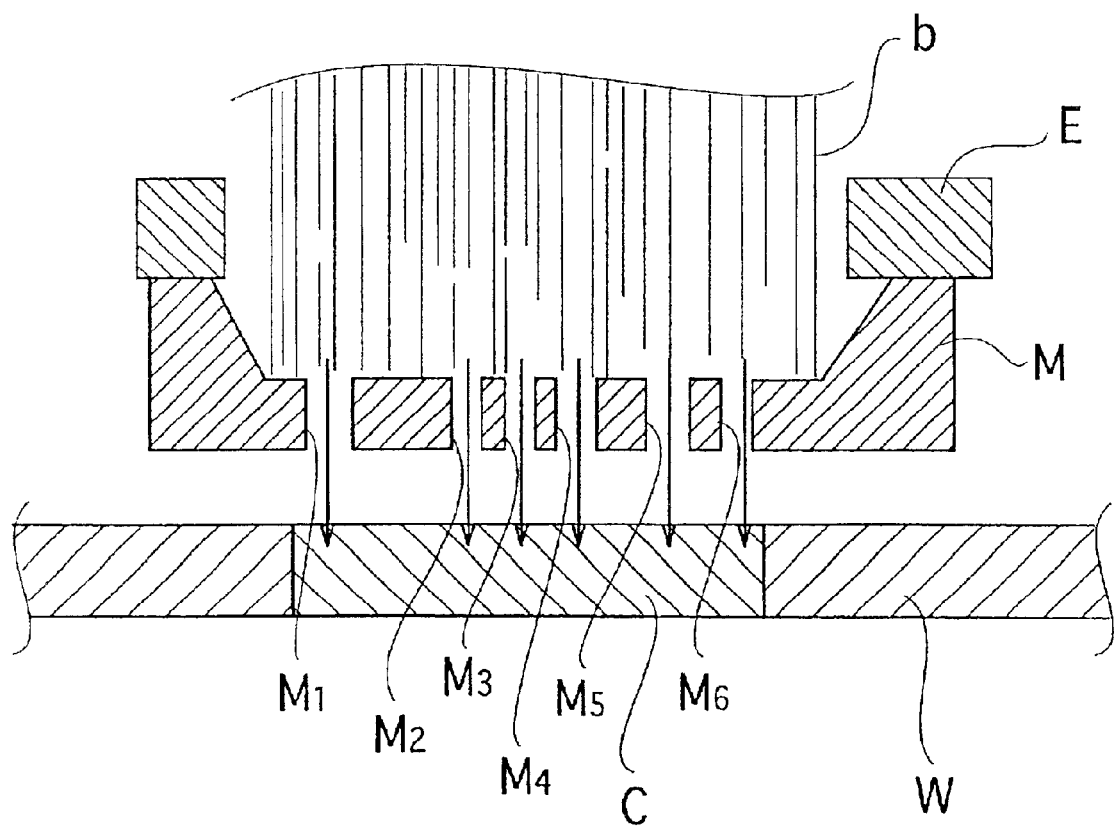
FIG. 10 is a cross-sectional view of a semiconductor substrate, chip, stencil mask and ion beam for explaining a spot ion beam implantation.
Figure 11:
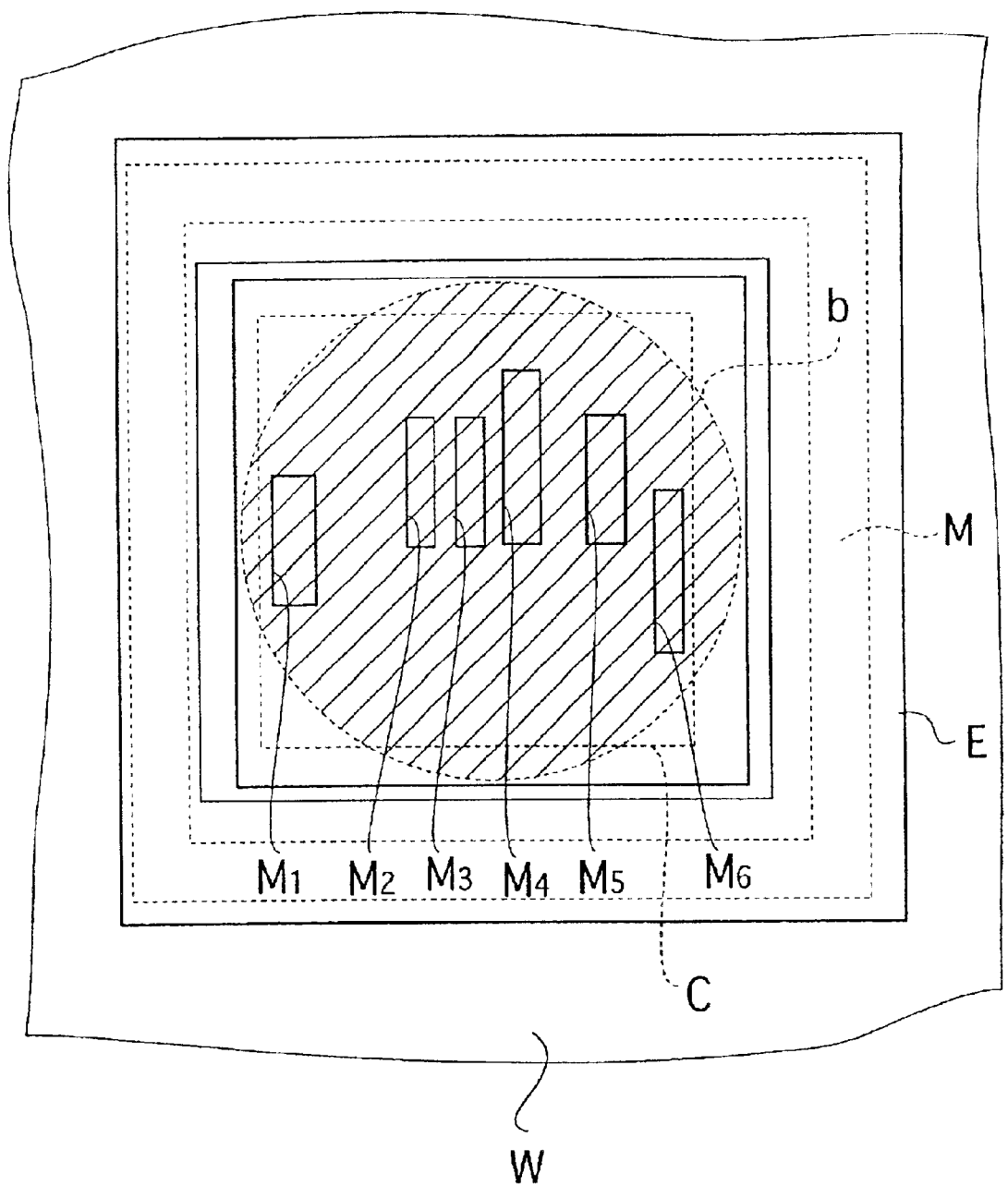
FIG. 11 is a plan view of the semiconductor substrate, chip, stencil mask and ion beam shown in FIG. 10.

In the above description, the relationship among the ion beam b, the stencil mask 12, the semiconductor substrate W and the chip C are schematically shown in size and geometry. They are shown more concretely in FIG. 10 to FIG. 13. Although numerous chips are formed in the semiconductor substrate W, only one chip is shown in FIG. 10. The stencil mask M is arranged approximately and directly above the chip C. As shown also in FIG. 11, openings $M_1$, $M_2$, $M_3$, $M_4$, $M_5$ and $M_6$ are made in the stencil mask M. It is fixed through an electro-static chuck E or the like to the inner wall of the end station chamber 10C. FIG. 10 and FIG. 11 show the ion beam spot implantation. The region receiving the ion beam spot is the mask region of the stencil mask M as shown in FIG. 11. The ion beam b is not scanned on the stencil mask M. It is static on the X-Y plane of the stencil mask M. The predetermined ions are implanted onto the chip C of the semiconductor substrate W through the openings $M_1$ to $M_6$ of the stencil mask M for a predetermined time.

Figure 12:
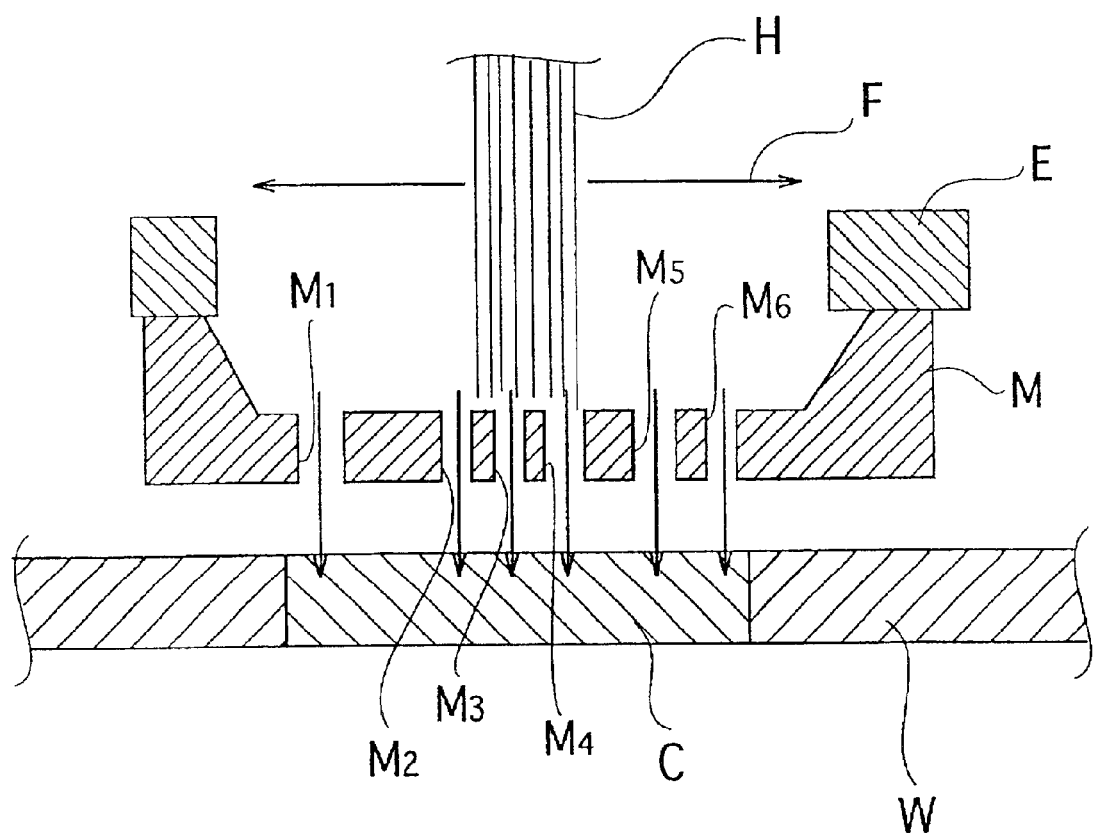
FIG. 12 is a cross-sectional view of a semiconductor substrate, chip, stencil mask and ion beam for explaining a scanning ion implantation.
Figure 13:
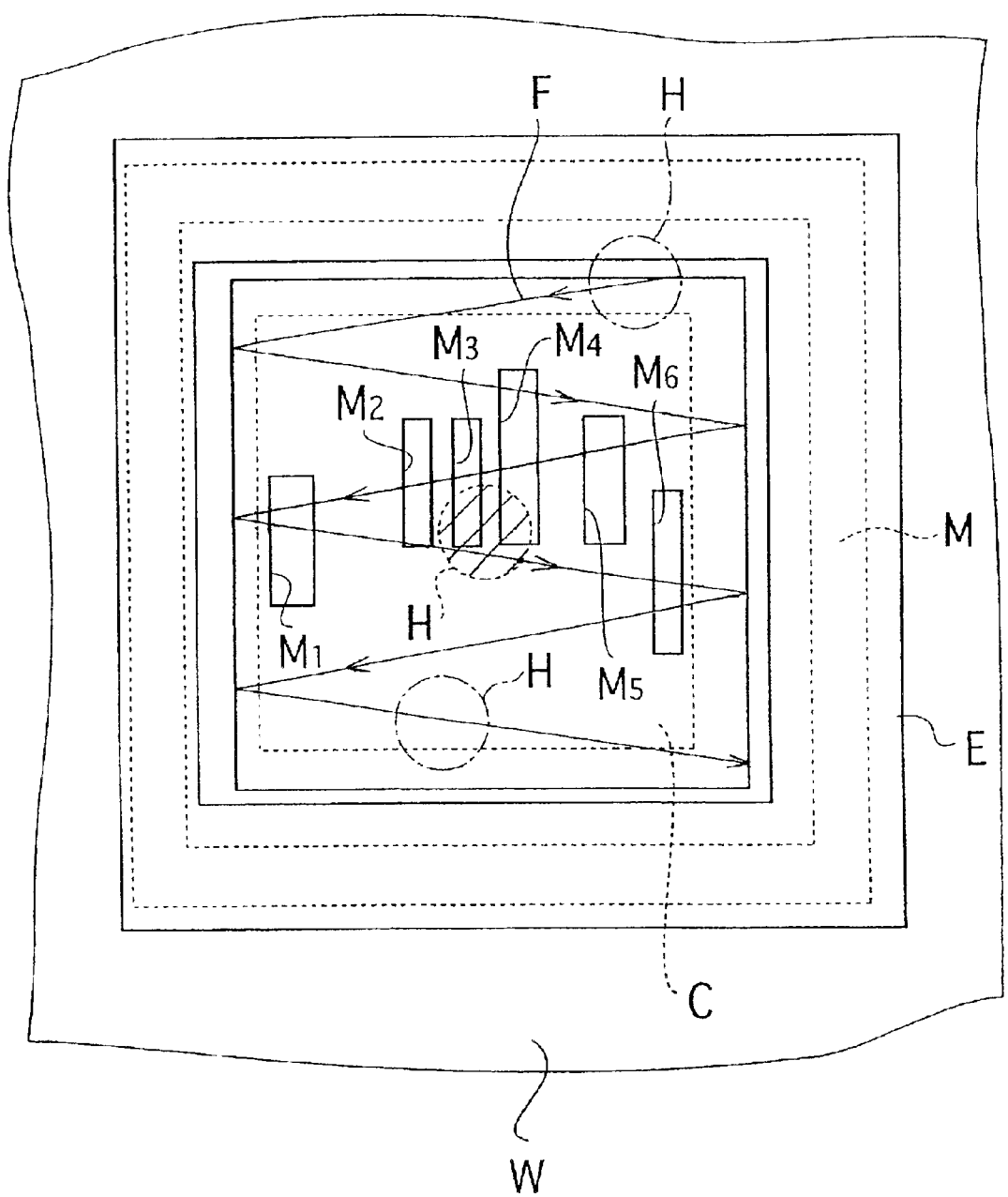
FIG. 13 is a plan view of the semiconductor substrate, chip, stencil mask and ion beam shown in FIG. 12.

FIG. 12 and FIG. 13 show the ion beam scanning on the stencil mask M. The beam H is not yet scanned by the beam scanner 6. The cross section is round as shown in FIG. 12 and FIG. 13. It is scanned along the zigzag lines F by the beam scanner 6, on the X-Y plane. Deflecting voltages (saw toothed wave voltages or triangular wave voltages) are applied to the electrodes for the deflecting of X-direction and the deflecting of Y-direction, in the beam scanner 6, respectively. The scan periods of the wave voltages are different from each other.

While the preferred embodiment of this invention has been described, of course, this invention is not limited to it, but variations thereto are possible on the basis of the present inventive concepts.

In the above embodiment, the X-, Y-, Z stage 19 is moved in the X-, Y-, and Z-directions. It may be rotated around the Z-axis by the angle θ. Or it may be tilted with respect to the X-axis or Y-axis. Accordingly, the stage 19 includes also a X-, Y-, Z (θ), (Tilt) stage.

In the above embodiment, there has not been described the control of the gap G between the semiconductor substrate W and the stencil mask 12. However, when ion implantations are effected chip by chip all over the whole surface of the semiconductor substrate W, it is important that the gap G is maintained at constant. The ion beam spreads wider below the stencil mask 12 with the increase of the gap G. The ions are implanted into the wider region than the opening of the stencil mask 12. When the gap G is small, there is the possibility that the semiconductor substrate W contacts with the stencil mask 12 and the latter is damaged. In some cases, the semiconductor substrate W is warped since it is repeatedly heated and cooled prior to the ion implantation. It is difficult at that case that the gap G is maintained at constant. Accordingly, an apparatus may be arranged for measuring the gap G in or outside of the end station chamber 10C, and the X-,Y-,Z stage 19 may be moved in the Z-direction, in accordance with the measure, by a drive mechanism, so as to maintain the gap G at constant.

Or warps of the semiconductor substrate W may be measured at different points and they may be memorized. The drive of the X-,Y-,Z stage 19 may be controlled with the memory in accordance with the measured points.

When the stencil mask 12 of FIG. 3 is used, the diameter of the spot beam is slightly larger than the mask region or the contour of the four chips C.

The semiconductor substrate is thermally treated in an electric furnace so as to repair crystal defects of the semiconductor substrate after the ion implantation and activate the implanted ions, in the prior art. The thermal treatment in the electric furnace takes relatively long time (20 to 30 minutes). Further, also other portions than the ion-implanted regions are heated, resulting in secondary crystal defects of the semiconductor substrate. Accordingly, it is preferable that the specified and ion-implanted regions in the semiconductor substrate are irradiated with laser beam from a laser oscillator arranged in the end station chamber 10C so as to thermally treat the semiconductor substrate in some milliseconds.

In the above embodiment, there has not be mentioned material of the stencil mask 12. It is preferably made of silicon. Of course, it may be made of another material. The semiconductor substrate is usually made of silicon. There is the possibility that the cut-off material from the edge of the opening of the stencil mask invades the semiconductor substrate. When the cut-off material is heavy metal, the semiconductor is badly influenced by the cut-off material. However, when it is the material as the semiconductor material, it can be avoided that the semiconductor substrate is badly influenced.

Further, the two ion sources 1A and 1B are used as the ion source means in the above embodiment. However, three or more than three ion sources may be used as the ion source means. Of course, stencil masks may be exchanged for the same ion source.

The effects of this invention are summarized as follows:

(1) The ion source means consists of plural ion sources in one implantation system. Accordingly, since the kind of the ions, the energy of the ions, and the dosage of the ion implantation can be changed in one unit, the system can be small sized.
(2) The stencil mask means consists of plural masks being exchangeable. Accordingly, a stencil mask can be selected in accordance with the selected ion source and the kind of the ions, the energy of the ion dosage of the ion implantation.
(3) The ion beam focusing/deflecting portion comprises a variable aperture for adjusting ion beam diameter, and a focus position changing lens, a beam scanner and collimator. Implantation modes of ion beams from plural ion beam sources can be various.
(4) The gaps between the semiconductor substrate and the stencil mask can be maintained at constant all over the surface of the semiconductor substrate. Accordingly, the implantation areas onto the specified regions of the semiconductor substrate can be constant. Accordingly, performances of manufactured semiconductor devices are stable.
(5) The parallel and density distribution of the ion beam are measured prior to the ion implantation. Accordingly. The ion implantation accuracy can be raised.
(6) Only the specified and ion-implanted regions can be thermally treated in the same end station chamber. Accordingly, the heat treatment process can be rationalized.
(7) The end station chamber is solely arranged in the closed space the temperature of which is controlled. Accordingly, the temperature of the end station chamber can be substantially constant. The clearance and distance of the parts in the end station chamber can be constant. Accordingly, with high accuracy, ions are implanted onto the specified regions.
(8) The end station chamber is put on the active controlled vibration-shielding frame. Accordingly, the end station chamber does not substantially vibrate, and so with high accuracy, the ions can be implanted onto the specified regions of the semiconductor substrate.
(9) The strength of the magnetic field is changed in the mass-analyzing portion. Accordingly, the desired ion source can be selected easily.

What is claimed is:

1. An ion implantation system comprising:
    (a) plural stationary ion sources for generating ion beams which include a multi-charged ion source for implanting ions at high energy and a high current ion source for implanting ions at a high dosage level;
    (b) a mass analyzing portion which has a magnetic field and which is connected to said plural stationary ion sources, and which has means for changing the strength of said magnetic field in order to select one of said plural stationary ion sources;
    (c) an ion acceleration portion for accelerating a beam of ions selected by said mass analyzing portion;
    (d) an ion beam processing portion which comprises,
        a variable aperture for adjusting the diameter of said ion beam,
        a focus point changing lens for focusing said ion beam and for changing a focus point for said ion beam,
        a beam scanner for scanning said ion beam on a semiconductor substrate, and a collimator positioned downstream of said beam scanner, which collimator parallels an ion beam array which passes through a focus region of said collimator;
    (e) an end station chamber in which said semiconductor substrate is placed; and
    (f) stencil mask means arranged relative to said semiconductor substrate in said end station chamber and which defines at least one region to be implanted on said semiconductor substrate, whereby;
    (i) when said mass analyzing portion selects said multi-charged ion source, said focus point changing lens focuses said ion beam onto said semiconductor substrate, said beam scanner scans said ion beam, and said collimator leads an axis of said scanned ion beam perpendicularly onto said semiconductor substrate and in parallel with any other scanned beams, and thereby said ion beams are scanned on said at least one region of said semiconductor substrate in parallel, or
    (ii) when said mass analyzing portion selects said high current ion source, said focus point changing lens focuses said ion beam onto said focus region of said collimator at the upstream side of said collimator, said ion beam is diverged after focusing, and said collimator collimates the diverged ion beam to be a parallel ion beam, and leads said parallel ion beam onto selected of said at least one specific regions of said semiconductor substrate simultaneously, or as a spot implantation.

2. An ion implantation system according to claim 1, in which said variable aperture is operable for adjusting the diameter of said ion beam, depending on a focus point which is slected by said focus point changing lens.

3. An ion implantation system according to claim 1, in which said multi-charged ion source is used for implanting ions at a dosage level in the range of $10^{11}$ to $10^{14}$ ions/cm$^2$.

4. An ion implantation system according to claim 1, in which said stencil mask means in said end station chamber consists of plural masks which are exchangeable to correspond with the selected one of said plural ion sources.

5. An ion implantation system according to claim 1, in which the position of said semiconductor substrate is so adjusted as to maintain a gap between said stencil mask means and said semiconductor substrate on the basis of the gap size or on the basis of premeasured warps of said semiconductor substrate.

6. An ion implantation system according to claim 1, in which a beam monitor for measuring the parallel and density distribution of the ion beam is movably arranged above or below said stencil mask means in said end station chamber.

7. An ion implantation system according to claim 1, in which a laser heat treatment apparatus is arranged for thermally treating the specified and ion-implanted regions in said semiconductor substrate in said end station chamber.

8. An ion implantation system according to claim 1, in which said end station chamber is arranged in a closed space wherein the temperature of which is controlled.

9. An ion implantation system according to claim 1, in which said end station chamber is positioned on an active controlled vibration shielding frame, whereby the ions can be accurately implanted onto a specified region of the semiconductor substrate.

10. An ion implantation method comprising:
 (a) the step of extracting ions from stationary ion source means and mass-analyzing said ions with a magnetic field;
 (b) the step of accelerating said ions for providing an ion beam;
 (c) the step of processing said ion beam;
 (d) the step of implanting said ions onto a semiconductor substrate, placed in an end station chamber, through stencil mask means arranged to correspond with the selected one ion source; and
 (e) in the step of mass-analyzing, changing the strength of the magnetic field for selecting one ion source from plural stationary ion sources as said ion source means; wherein
 (f) in a desired case of medium or low dosage implantation said step of processing said ion beam comprises:
  (i) a step of adjusting the ion beam from said selected one ion source to a dosage level in the range of $10^{11}$ to $10^{14}$ ions/cm$^2$ by a variable aperture;
  (ii) a step of focusing said ion beam onto said semiconductor substrate by a focus position changing lens;
  (iii) a step of scanning said ion beam on said semiconductor substrate through said stencil mask means by a beam scanner; and
  (iv) a step of paralleling said scanned ion beam with any other scanned ion beams by a collimator, whereby ions are uniformly and widely implanted onto said semiconductor substrate; or wherein
 (g) in a desired case of high dosage implantation, said step of processing said ion beam, comprises:
  (i) a step of adjusting the ion beam from said selected one ion source to a dosage level in the range of $10^{14}$ to $10^{16}$ ions/cm$^2$ by said variable aperture;
  (ii) a step of focusing said ion beam onto a focus region of said collimator by said focus position changing lens; and
  (iii) a step of paralleling the beam ion array by said collimator, whereby ions are widely implanted onto said semiconductor substrate.

11. An ion implantation method according to claim 10, in which the position of said semiconductor substrate is so adjusted in ion implantation as to maintain a gap between said stencil mask means and said semiconductor substrate at a predetermined value on a basis of measures selected from the group of measures consisting of gap measure and premeasured warps of said semiconductor substrate, whereby said semiconductor substrate is irradiated with ions with accuracy.

12. An ion implantation method according to claim 10, in which parallel and density distribution of said ion beams is measured before the step of ion-implantation and said ion beam is so focused and deflected as to be wihin the permissible range of said parallel and density distribution.

13. An ion implantation method according to claim 10, in which a specified ion implantation region of said semiconductor substrate is thermally treated in said end station chamber.

14. An ion implantation method according to claim 10, in which said end station chamber is arranged in a closed space and including the step of controlling the temperature of a semiconductor substrate on to which ions are to be implanted in the closed space.

15. An ion implantation method according to claim 10, in which a semiconductor substrate onto which ions are to be implanted is supported in said end station chamber placed on an active controlled vibration-shielding, whereby the ions can be uniformly implanted with accuracy onto said semiconductor substrate.

* * * * *